(12) United States Patent
Matsui

(10) Patent No.: US 6,300,813 B1
(45) Date of Patent: Oct. 9, 2001

(54) DELAY CIRCUIT

(75) Inventor: Yuuji Matsui, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/412,022

(22) Filed: Oct. 5, 1999

(30) Foreign Application Priority Data

Oct. 7, 1998 (JP) ................................................. 10-285372

(51) Int. Cl.$^7$ .................................................... H03H 11/26
(52) U.S. Cl. ............................................ 327/288; 327/284
(58) Field of Search .................................... 327/284, 264, 327/285, 288, 276, 277

(56) References Cited

U.S. PATENT DOCUMENTS

| | | | | |
|---|---|---|---|---|
| 5,552,719 | * | 9/1996 | Murakami ................................ | 326/27 |
| 5,663,670 | * | 9/1997 | Idanza et al. .......................... | 327/281 |
| 5,731,725 | * | 3/1998 | Rothenberger et al. .............. | 327/262 |

FOREIGN PATENT DOCUMENTS

| | | |
|---|---|---|
| 6282715 | 4/1987 | (JP) . |
| 63257324 | 10/1988 | (JP) . |
| 6469116 | 3/1989 | (JP) . |
| 329411 | 2/1991 | (JP) . |
| 6188699 | 7/1994 | (JP) . |
| 9214306 | 8/1997 | (JP) . |
| 9331238 | 12/1997 | (JP) . |

OTHER PUBLICATIONS

"Horowitz And Hill: The Art of Electronics," Paul Horowitz and Winfield Hill, Cambridge University Press 1980, p. 245.*

* cited by examiner

Primary Examiner—Toan Tran
Assistant Examiner—Cassandra Cox
(74) Attorney, Agent, or Firm—Young & Thompson

(57) ABSTRACT

A delay circuit having: a first delay inverter having complementarily-connected first p-channel FET and first n-channel FET, one of the first p-channel and first n-channel FETs being provided with a gate length elongated; a second delay inverter having complementarily-connected second p-channel FET and second n-channel FET, one of the second p-channel and second n-channel FETs being provided with a gate length elongated; a NAND gate having a first input to which the input signal is applied and a second input to which the output signal of the second delay inverter is applied; and an inverter to output inverting the output signal of the NAND gate.

4 Claims, 4 Drawing Sheets

DELAY CIRCUIT

FIELD OF THE INVENTION

This invention relates to a delay circuit, and more particularly to, a delay circuit including delay inverters composed using p-channel and n-channel FETs (field effect transistor).

BACKGROUND OF THE INVENTION

FIG. 1 shows a conventional delay circuit. The first input of a two-input NAND gate 2 is connected to input terminal 1. Also, to the input terminal 1, a delay inverter (INV) 3 and a delay inverter 4 are connected in series. The second input of the NAND gate 2 is connected to the output of the delay inverter 4. An inverter 5 is connected to the output of the NAND gate 2, and the output of the inverter 5 is connected to output terminal 6. The delay inverter 3 and the delay inverter 4 have a same composition, and each of them is composed of a CMOS transistor (CMOS transistor) The delay inverter 3 is composed of a p-type MOSFET (p-channel transistor, hereinafter referred to as 'PchTr') 3a and a n-type MOSFET (n-channel transistor, hereinafter referred to as 'NchTr') 3b that are connected complementarily. The delay inverter 4 is composed of a PchTr 4a and a NchTr 4b that are connected complementarily.

In the composition shown in FIG.4, when there is no input signal IN, "H" level signal is applied to the input terminal 1. Signal input to the delay inverters 3, 4 side is inverted two times, therefore "H" level signals are input to both the inputs of the NAND gate 2. Thus, the output of the NAND gate 2 holds "L" level unalteredly. The output of the inverter 5 holds "H" level.

When input signal IN varies, i.e. a Low pulse generates, it is inverted at the inverter 3, thereby Low pulse part is changed into High pulse as well as providing a delay of $t_1$ for the entire signal. This signal is further inverted and provided with a delay of $t_2$ at the inverter 4, and is then applied to the second input of the NAND gate 2. The NAND gate 2 outputs "H" level signal unless both the input signals are "H" level. Namely, from a time point at the start edge (FALL) of input signal IN to a time point at the end edge (RISE) of output signal of the inverter 4, a "H" level signal is output from the NAND gate 2. This signal is inverted by the inverter 5 as well as being provided with a predetermined delay time. The output signal of the inverter 5 is output from the output terminal 6 as output signal OUT with end edge (RISE) delayed at the same mode (Low pulse) as the input signal IN.

Usually, in semiconductor devices, its pulse width, timing of various signals etc. are adjusted by a delay circuit. Even when the delay amount of delay circuit is dispersed due to a variation in process, the delay circuit can operate because it is designed provided with a margin in delay amount.

However, in the conventional delay circuit, when the operating frequency becomes as high as 100 to 200 MHz, due to the margin in delay amount, a desired performance is difficult to obtain and it is therefore necessary to enhance the precision. For example, a delay circuit used for a semiconductor memory uses pulse signal to pre-charge a digit line to be subject to the reading and writing. However, when trying to get such a pulse width that can be pre-charged certainly even under a condition that the pulse width becomes shortest, i.e. a condition that the gate length L shortens or the power-source voltage VDD increases, on the contrary, the operating speed of semiconductor memory is determined according to a condition that the pulse width becomes longest. Thus, a desired characteristic cannot be obtained.

SUMMARY OF THE INVENTION

Accordingly, it is an object of the invention to provide a delay circuit that the variation of delay time due to a variation in manufacturing process can be reduced.

According to the invention, a delay circuit, comprises:
a delay inverter for generating an output signal obtained by providing an input signal with a predetermined delay time;
wherein the delay inverter is composed of a p-channel FET and a n-channel FET that are connected complementarily, and one of the p-channel FET and n-channel FET is provided with a gate length elongated according to the logic of the input signal.

In this composition, paying attention to that the variation of gate length corresponds to the variation of signal pulse width, when the logic of input signal, for example, the end edge (RISE) of Low pulse needs the precision of delay time, the gate length of FET that varies from a turned-OFF state to a turned-ON state is elongated.

Thereby, the output speed is slowed, therefore the delay variation becomes small. As a result, the precision in delay time can be enhanced.

According to another aspect of the invention, a delay circuit, comprises:
a first delay inverter comprising a first p-channel FET and a first n-channel FET complementarily connected to the first p-channel FET, one of the first p-channel FET and the first n-channel FET being provided with a gate length elongated, the first p-channel FET and the first n-channel FET having gates which are connected commonly and to which input signal is applied;
a second delay inverter comprising a second p-channel FET and a second n-channel FET complementarily connected to the second p-channel FET, one of the second p-channel FET and the second n-channel FET being provided with a gate length elongated, the output of the first delay inverter being input to the second delay inverter;
a NAND gate comprising a first input to which the input signal is applied and a second input to which the output signal of the second delay inverter is applied; and
an inverter to output inverting the output signal of the NAND gate.

In this composition, both the delay inverters used in delaying are composed the complementarily-connected p-channel FET and n-channel FET, the gate of one of the FETs is designed provided with an elongated gate length L according to the logic of input signal. Paying attention to that the gate length L of FET affects the precision of delay time of delay circuit, when the logic of input signal, for example, the end edge (RISE) of Low pulse needs the precision of delay time, the gate length of FET that varies from a turned-OFF state to a turned-ON state is elongated. In detail, the gate lengths of the first n-channel FET and the second p-channel FET are elongated. Thereby, the output speed is slowed, therefore the delay variation becomes small. As a result, the precision in delay time can be enhanced.

BRIEF DESCRIPTION OF THE DRAWINGS

The invention will be explained in more detail in conjunction with the appended drawings, wherein.

DESCRIPTION OF THE PREFERRED EMBODIMENTS

Figure 1:
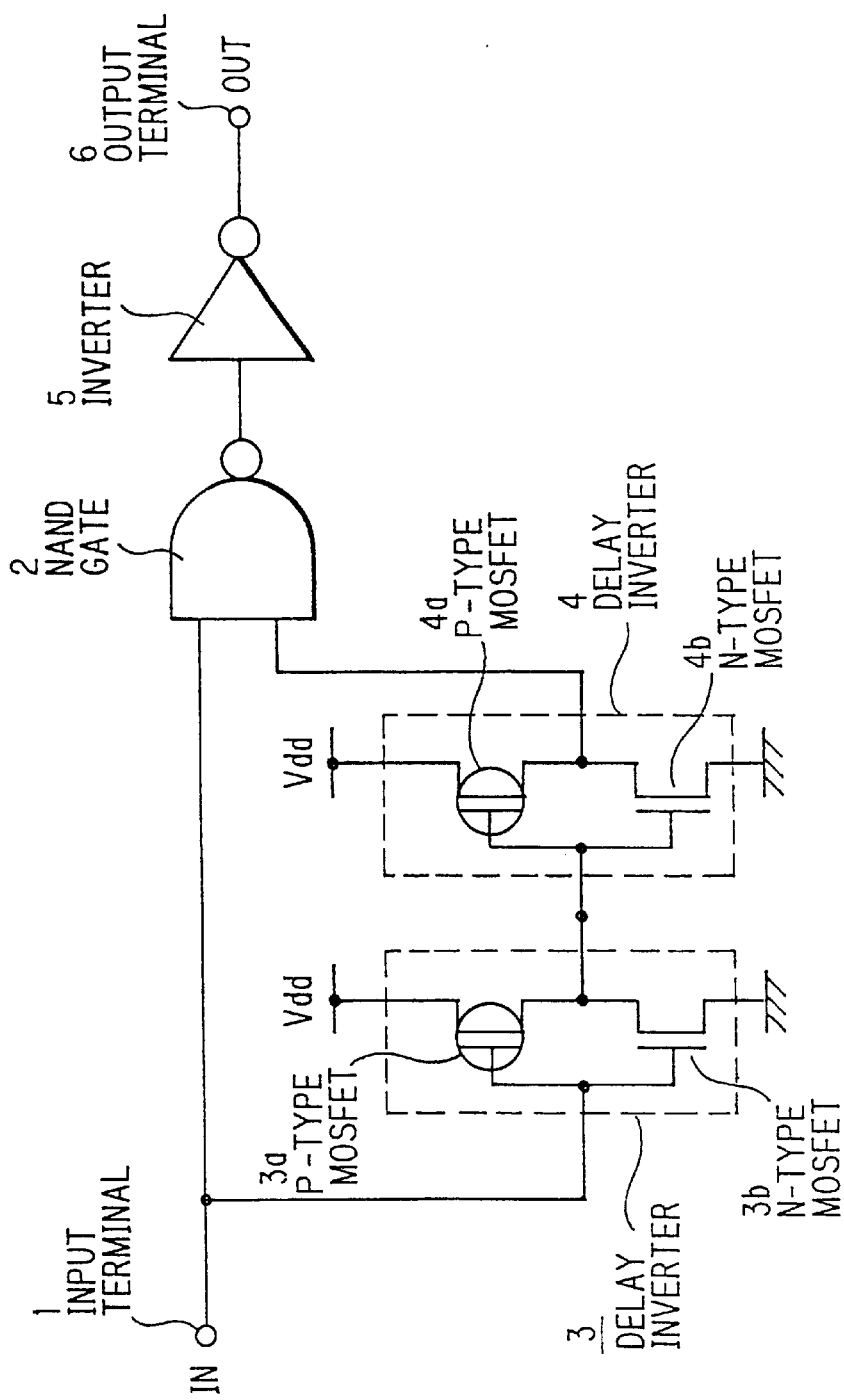
FIG. 1 is a circuit diagram showing the composition of the conventional delay circuit.

The preferred embodiment of the invention will be explained below, referring to the drawings.

Figure 2:
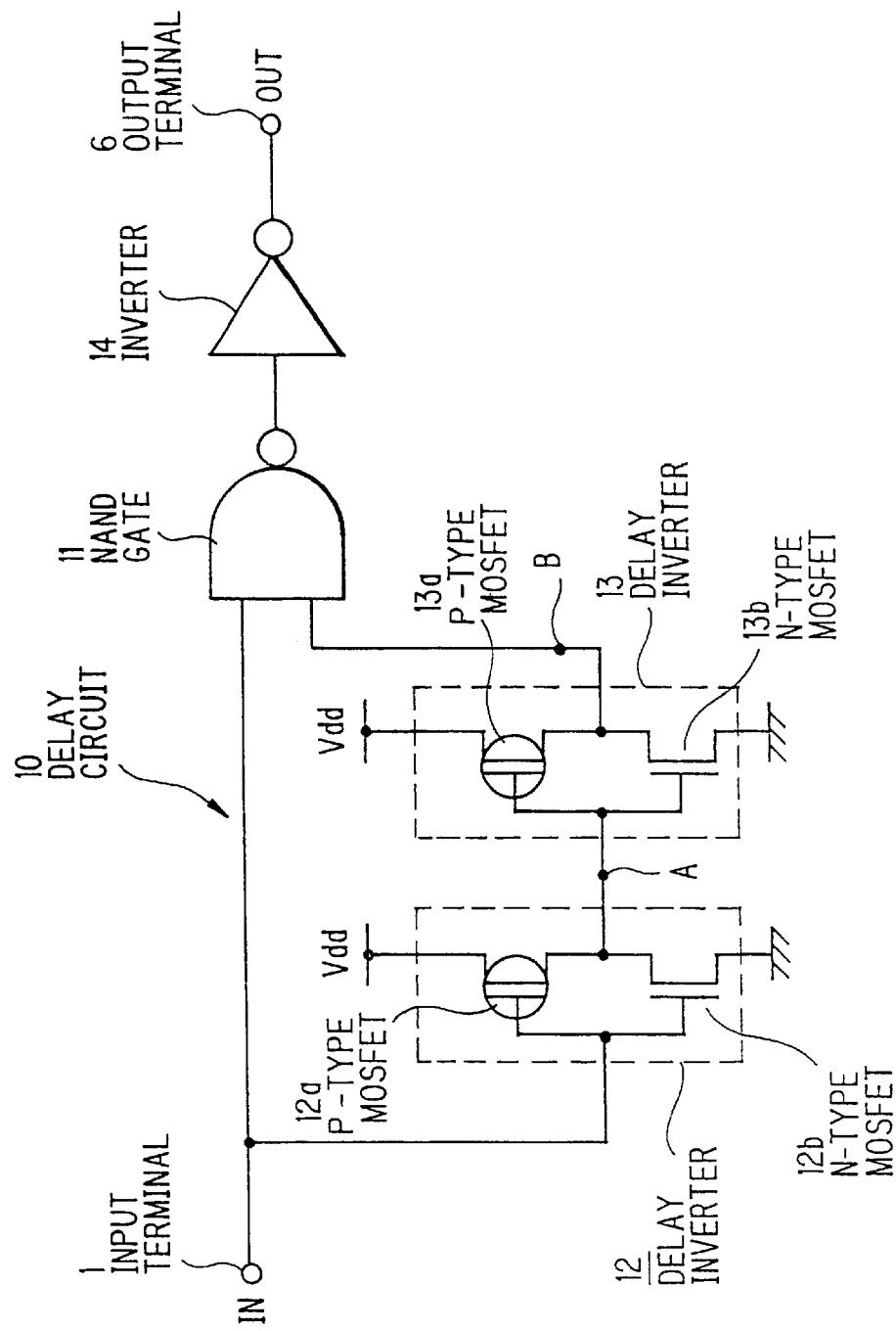
FIG. 2 is a circuit diagram showing the composition of a delay circuit in a preferred embodiment according to the invention, FIG. 3 (*a*) is a circuit diagram showing a delay inverter in FIG. 2, FIG. 3 (*b*) is a plan view showing the delay inverter in FIG. 3 (*a*)

FIG. 2 shows a delay circuit in the preferred embodiment according to the invention. The delay circuit 10 of the invention is composed of a NAND gate 11 whose first input is connected to the input terminal 1, delay inverters 12, 13 that are connected in series and are inserted between the input terminal 1 and the second input of the NAND gate 11, and an inverter 14 that is inserted between the NAND gate 11 and the output terminal 6.

The delay inverters 12, 13 have a common composition electrically, but their device structures are different from each other. The delay inverter 12 is composed of a p-type MOSFET (PchTr) 12*a* and a n-type MOSFET (NchTr) 12*b* that are connected complementarily. The delay inverter 13 is composed of a PchTr 13*a* and a NchTr 13*b* that are connected complementarily.

Figure 3A:
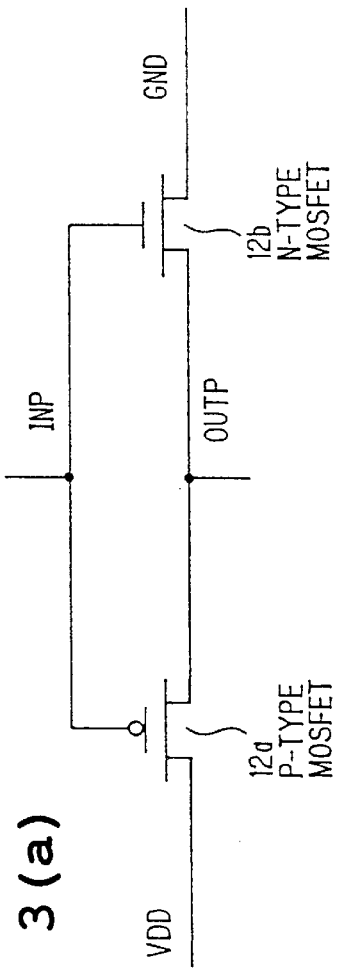
Figure 3B:
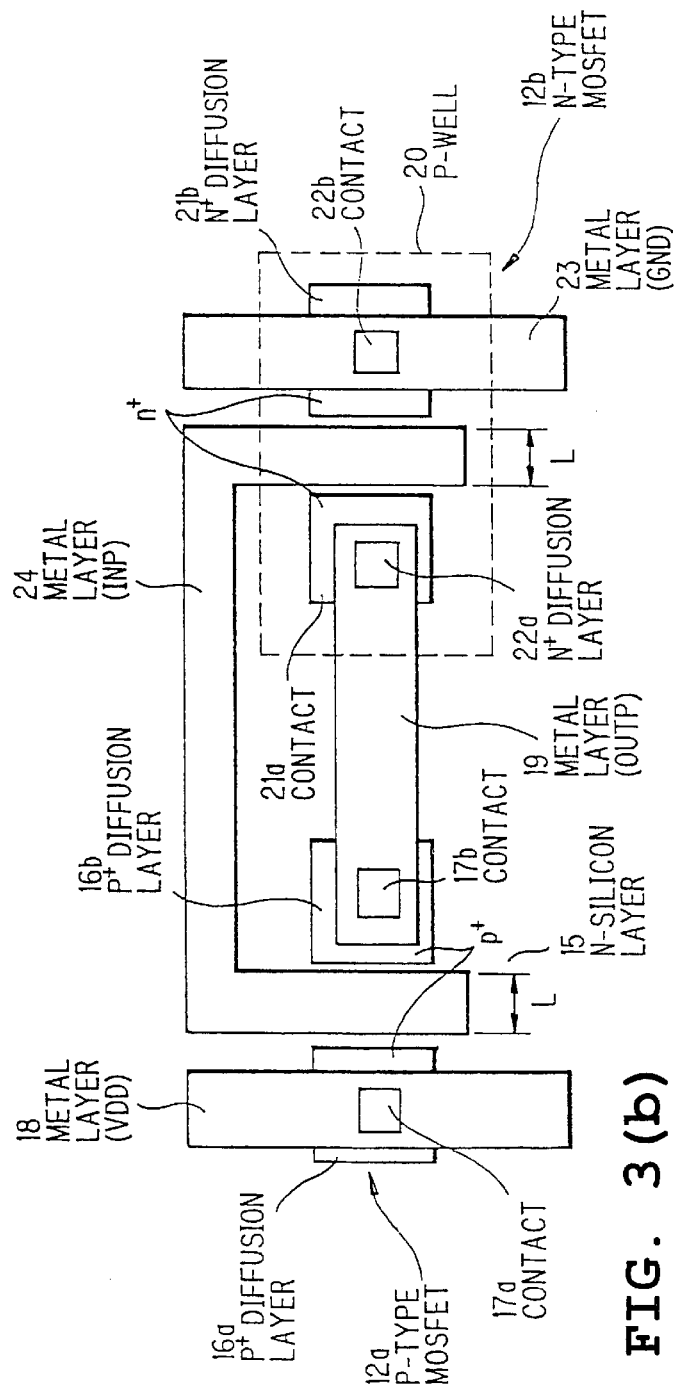

FIGS. 3 (*a*) and (*b*) shows the layout of the delay inverters 12, 13. Here, the delay inverter 12 is taken as an example. The inverter 12 with a connection composition in FIG. 3 (*a*) is provided with an electrode arrangement in FIG. 3 (*b*). "INP" is an input terminal, which is connected to the respective gates of the PchTr 12*a* and NchTr 12*b*. "VDD" is a power-source terminal connected to the source of the PchTr 12*a*, "GND" is a ground terminal connected to the source of the NchTr 12*b*, "OUTP" is an output terminal connected to the respective drains of the PchTr 12*a*, NchTr 12*b*.

As shown in FIG. 3 (*b*), the PchTr 12*a* and NchTr 12*b* are formed on one silicon substrate. An n$^-$ silicon layer 15 as the silicon substrate is used as the substrate of the PchTr 12*a*. In the PchTr 12*a*, two p$^+$ diffusion layers 16*a*, 16*b* for the source and drain are formed on the n$^+$ silicon layer 15 keeping a predetermined distance therebetween. On the p diffusion layers 16*a*, 16*b* an insulation film (not shown) is formed. Contacts 17*a*, 17*b* are connected to the p$^+$ diffusion layers 16*a*, 16*b* respectively penetrating through the insulation layer. A metal layer 18 as the power-source terminal VDD is connected to the contact 17*a*. Also, one end of a metal layer 19 as the output terminal OUTP is connected to the contact 17*b*.

In the NchTr 12*b*, a p-silicon region (p-well) 20 is formed on the n$^-$ silicon layer 15. no diffusion layers 21*a*, 21*b* are formed on the p-well 20 keeping a predetermined distance therebetween. On that surface, the insulation layer is formed extending. Contacts 22*a*, 22*b* are connected to the n diffusion layers 21*a*, 21*b*, respectively penetrating through the insulation layer. The contact 22*a* is connected to the other end of the metal layer 19, the contact 22*b* is connected to a metal layer 23 as the ground terminal "GND". Further, between then diffusion layers 21*a* and 21*b* and between the p$^+$ diffusion layers 16*a*and 16*b*a metal layer 24 (INP) as the gate electrode is provided in the form of reverse-U.

The width of the metal layer 24 in the alignment direction of contacts is a gate length L. In this invention, this gate length L is made to be different between the delay inverter 12*a* or 13*a* and the delay inverter 12*b* or 13*b*. Namely, when the start edge (RISE) or end edge (FALL) of input signal needs the precision of delay time, according to the logic of signal (FALL or RISE), the gate length L of either of PchTr and NchTr composing the delay inverter is increased. The biggest factor that affects the precision of delay circuit is a variation in manufacturing process, especially a dispersion of gate length L. So, in this invention, an optimum gate length L is selected to cope with the variation in manufacturing process. By increasing the gate length L, it is intended to reduce the rate of variation in pulse width to be output.

In the composition in FIG. 1, of input signal IN (pulse signal), the end edge of signal passing through the delay inverters 12, 13 determines the width of Low pulse to be output from the output terminal 6. Also, mattered when the delay precision is needed is the precision of the end edge (RISE) of Low pulse, of input signal IN passing through the inverters 12, 13. So, only the gate length L of either of NchTr and PchTr of the delay inverter 12 or 13 is increased. In detail, only the gate length L of the NchTr 12*b* of the first-stage delay inverter 12 is increased, and the gate length L of the PchTr 12*a* is kept unaltered. Further, the gate length L of the NchTr 13*b* of the second-stage delay inverter 13 is kept unaltered, and the gate length L of the PchTr 13*a* is increased. By designing thus, the affection by the variation in manufacturing process can be reduced, therefore the dispersion of delay time can be reduced.

Figure 4:
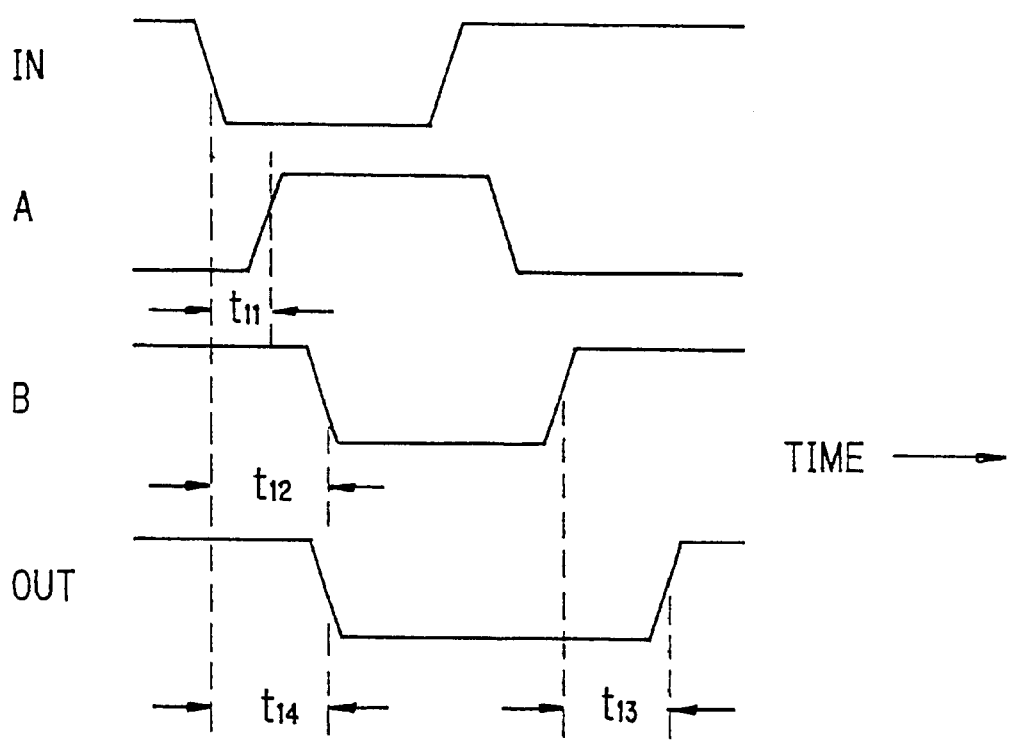
FIG. 4 is a waveform diagram at several points of the delay circuit in FIG. 2.

FIG. 4 shows waveforms at several points of the delay circuit in FIG. 2. In FIG. 4, "IN" is a waveform of input signal at the input terminal 1, "OUT" is a waveform of output signal at the output terminal 6, "A" is a waveform of output signal of the delay inverter 12, and "B" is a waveform of output signal of the delay inverter 13. The delay inverter 12 inverts input signal IN and creates a delay time of t11. Then, the delay inverter 13 inverts it to generate the same Low pulse waveform as input signal IN, and creates a delay time of t12. As a result, by the delay inverters 12, 13, a delay time of t13 is given to input signal IN. Further, output signal of the NAND gate 11 is inverted by the inverter 14, and signal that a delay time of t14 is given to the start edge (FALL) of input signal IN is output, as Low pulse output signal, from the output terminal 6.

As shown in FIG. 4, signal to determine the start edge (FALL) of Low pulse output from the output terminal 6 is input signal IN (pulse signal) input to the first input of the NAND gate 11. Also, signal to determine the end edge (FALL) is signal input to the second input of the NAND gate 11.

Here, in the manufacturing process, both NchTr and PchTr have a gate length of 0.35 μm, and the range of variation of gate length is ±0.03 μm. When the gate length L of the delay inverters 12, 13 manufactured is 0.35 μm for both NchTr and PchTr, the dispersion of gate length L is ±0.03 μm and the rate of variation of gate is ±8.5%. The rate of variation in pulse width of output signal at the output terminal 6 is similar to this, while it depends on the characteristic of transistor (Tr).

For example, it is assumed that the gate length L is reduced by 0.03 μm due to the variation in manufacturing process and thereby the performance of transistor increases according to the variation of gate length L. Here, assuming that the increment of transistor performance is equal to the variation amount of gate length L, when L=0.35 μm reduces to 0.32 μm and L=1.0 μm reduced to 0.97 μm, the transistor performance increases by 8.5% and 3%, respectively.

In the delay inverter 12, the gate length L of the NchTr 12b is 0.97 μm and the gate length L of the PchTr 12a is 0.32 μm. Therefore, as to the variation amount of transistor performance by the manufacturing process, the PchTr 12a is more than NchTr 12b. When RISE signal is input to the delay inverter 12, FALL signal is output from the delay inverter 13. Hereupon, the increment of performance of PchTr as a load of outputting is 8.5% more than 3% for the conventional composition. Therefore, the output speed is not faster than the conventional delay circuit. Namely, the delay circuit obtained is provided with a variation amount smaller than the conventional delay circuit. Also, when the gate length L increases, on the contrary, due to the variation in manufacturing process, a like result can be obtained. As to the decrement of transistor performance, the PchTr 12a is more than NchTr 12b. The load to the NchTr 12b becomes smaller, therefore the delay of output signal becomes smaller.

Although in the delay inverter 12 the precision of output signal to RISE is high, the precision of output signal to FALL becomes worse than the conventional delay circuit. However, this problem can be solved by inputting the start edge (FALL) of input signal through the delay inverters 12, 13 to the second input of the NAND gate 11, and by making this state earlier than the end edge (RISE) of Low pulse of input signal applied directly to the NAND gate 11.

In the above embodiment of the invention, two delay inverters are used to compose the delay circuit, but the number of delay inverters may be arbitrary.

ADVANTAGES OF THE INVENTION

In this invention, according to the logic of input signal, the gate length of one of p-channel and n-channel FETs composing the delay inverter is increased. Thereby, the output speed is slowed, therefore the delay variation becomes small. As a result, the precision in delay time can be enhanced.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A delay circuit, comprising:
a delay inverter for generating an output signal obtained by providing an input signal with a predetermined delay time;
wherein said delay inverter is composed of a p-channel FET and a n-channel FET that are connected complementarily, and one of said p-channel FET and n-channel FET is provided with a gate length elongated and different from the other of said p-channel FET and said n-channel FET according to the logic of said input signal.

2. A delay circuit, according to claim 1, wherein:
said delay inverter is composed of a first delay inverter to which a Low pulse signal as said input signal is input, and a second delay inverter to which a output signal of said first delay inverter is input, and
the n-channel FET of said first delay inverter and the p-channel FET of said second delay inverter are provided with a gate length elongated.

3. A delay circuit, comprising:
a first delay inverter comprising a first p-channel FET and a first n-channel FET complementarily connected to said first p-channel FET, one of said first p-channel FET and said first n-channel FET being provided with a gate length elongated, said first p-channel FET and said first n-channel FET having gates which are connected commonly and to an which input signal is applied;
a second delay inverter comprising a second p-channel FET and a second n-channel FET complementarily connected to said second p-channel FET, one of said second p-channel FET and said second n-channel FET being provided with a gate length elongated, the output of said first delay inverter being input to said second delay inverter;
a NAND gate comprising a first input to which said input signal is applied and a second input to which the output signal of said second delay inverter is applied; and
an inverter to invert the output signal of said NAND gate.

4. A delay circuit, according to claim 3, wherein:
said FET provided with the elongated gate length in said first second delay inverters is determined according to the logic of input signal.

* * * * *